(12) United States Patent
De La Rosa et al.

(10) Patent No.: US 11,552,432 B2
(45) Date of Patent: Jan. 10, 2023

(54) METHODS AND APPARATUS FOR RF SHIELD AND CABLE ATTACHMENT SYSTEM

(71) Applicant: High Speed Interconnects, LLC, Scottsdale, AZ (US)

(72) Inventors: Antonio De La Rosa, Scottsdale, AZ (US); Todd Albertson, Portland, OR (US)

(73) Assignee: High Speed Interconnects, LLC, Scottsdale, AZ (US)

( * ) Notice: Subject to any disclaimer, the term of this patent is extended or adjusted under 35 U.S.C. 154(b) by 0 days.

(21) Appl. No.: 16/984,649

(22) Filed: Aug. 4, 2020

(65) Prior Publication Data
US 2021/0050691 A1     Feb. 18, 2021

Related U.S. Application Data

(60) Provisional application No. 62/885,548, filed on Aug. 12, 2019.

(51) Int. Cl.
| | |
|---|---|
| *H01R 13/6581* | (2011.01) |
| *H01R 13/24* | (2006.01) |
| *H01R 13/6598* | (2011.01) |
| *H01R 12/52* | (2011.01) |
| *H05K 3/34* | (2006.01) |
| *H05K 9/00* | (2006.01) |

(52) U.S. Cl.
CPC ......... *H01R 13/6581* (2013.01); *H01R 12/52* (2013.01); *H01R 13/2407* (2013.01); *H01R 13/2492* (2013.01); *H01R 13/6598* (2013.01); *H05K 3/341* (2013.01); *H05K 9/0098* (2013.01); *H05K 2201/10734* (2013.01)

(58) Field of Classification Search
CPC ............... H01R 13/6581; H01R 12/52; H01R 13/2407; H01R 13/2492; H01R 13/6598; H05K 3/341; H05K 2201/10734; H05K 9/0098
See application file for complete search history.

(56) References Cited

U.S. PATENT DOCUMENTS

| | | |
|---|---|---|
| 2,981,788 A | 4/1961 | Bunish |
| 3,211,821 A | 10/1965 | Wakefield |
| 3,614,300 A | 10/1971 | Wilson et al. |
| 3,651,243 A | 3/1972 | Hornor et al. |
| 3,673,315 A | 6/1972 | Lasley |
| 3,816,644 A | 6/1974 | Giffel et al. |
| 4,000,558 A | 1/1977 | Cahill |

(Continued)

FOREIGN PATENT DOCUMENTS

| | | | |
|---|---|---|---|
| WO | 03094203 A2 | 11/2003 | |
| WO | WO-03094203 A2 * | 11/2003 | ....... H01L 23/49805 |

*Primary Examiner* — Abdullah A Riyami
*Assistant Examiner* — Justin M Kratt
(74) *Attorney, Agent, or Firm* — Noblitt & Newson, PLLC (57) ABSTRACT

A shield for a cable attachment system for attaching a cable to a component having a ball grid array (BGA). The shield may comprise an outer conductive surface, a first end configured to be coupled to a surface of the component, a second end that receives the cable, and an inner non-conductive material received within the shield adjacent the first end and encasing the connection of the cable to the BGA of the component. The cable may be configured to be coupled to the BGA of the component.

19 Claims, 7 Drawing Sheets

(56) References Cited

U.S. PATENT DOCUMENTS

| | | |
|---|---|---|
| 4,234,759 A | 11/1980 | Harlow |
| 4,358,636 A | 11/1982 | Ijff et al. |
| 4,374,299 A | 2/1983 | Kincaid |
| 4,552,989 A | 11/1985 | Sass |
| 4,860,343 A | 8/1989 | Zetena, Jr. |
| 5,416,269 A | 5/1995 | Kemp et al. |
| 5,760,744 A | 6/1998 | Sauer |
| 5,828,555 A | 10/1998 | Itoh |
| 5,956,445 A | 9/1999 | Dietz, Sr. et al. |
| 6,444,902 B1 | 9/2002 | Tsao et al. |
| 6,486,395 B1 | 11/2002 | Temblador |
| 6,903,934 B2 | 6/2005 | Lo et al. |
| 6,963,265 B2 | 11/2005 | Cooper et al. |
| 7,166,802 B2 | 1/2007 | Cusson et al. |
| 7,309,835 B2 | 12/2007 | Morrison et al. |
| 7,518,063 B2 | 4/2009 | Zhang et al. |
| 8,039,749 B2 | 10/2011 | Okano et al. |
| 9,443,646 B2 | 9/2016 | Armbrecht et al. |
| 2002/0048974 A1 | 4/2002 | Michel et al. |
| 2004/0094328 A1 | 5/2004 | Fjelstad et al. |
| 2005/0011664 A1 | 1/2005 | Lee |
| 2005/0208828 A1 | 9/2005 | Miller et al. |
| 2010/0051318 A1 | 3/2010 | Wang |
| 2010/0084157 A1 | 4/2010 | Wang |
| 2012/0330570 A1 | 12/2012 | Hedl et al. |
| 2015/0034358 A1 | 2/2015 | Armbrecht et al. |
| 2015/0144381 A1 | 5/2015 | Foo |
| 2020/0091661 A1* | 3/2020 | Takahashi ............ H01R 12/716 |
| 2021/0104843 A1* | 4/2021 | Tobey .................... H01R 43/01 |

* cited by examiner

METHODS AND APPARATUS FOR RF SHIELD AND CABLE ATTACHMENT SYSTEM

CROSS-REFERENCE TO RELATED APPLICATIONS

The present application claims the benefit of U.S. Provisional Application Ser. No. 62/885,548, filed Aug. 12, 2019, entitled "Methods and Apparatus for Shield and Cable Attachment System" and incorporates the disclosure of the application by reference.

BACKGROUND OF THE TECHNOLOGY

Micro sensing components such as endoscopes, guidewires, catheters, cameras, and the like require small form factors that inherently create installation and manufacturing concerns for discrete cable or coaxial cable termination. For example, devices such as endoscopes, guidewires, catheters, or cameras typically have a ball grid array to facilitate the signal transfers to or from the device and/or to provide power. However, because these types of devices have size constraints on the order of 3 millimeters or less, cable design and proper termination of the cable at the device can be problematic.

Common methods of terminating shielded or coaxial cables to ball grid arrays (BGA) utilize direct connection to the BGA. These types of connections may create a manufacturing concern since connecting such a small length of wire within the space constraints of the assembly requires precision slowing down the manufacturing process and potentially leading to excessive manufacturing inefficiencies or assembly quality problems.

Further, this type of connection increases the required termination region/distance and/or a corresponding outer diameter of the termination. This may lead to a situation where the outer diameter of the termination or the length of the termination region exceeds an allowed size constraint for a particular device type or application.

SUMMARY OF THE TECHNOLOGY

Methods and apparatus for an RF shield and cable attachment system according to various aspects of the present technology include a modular holder assembly having enhanced connection and termination capabilities. In various embodiments, shield for a cable attachment system for attaching a cable to a component having a ball grid array (BGA) is provided. The shield may comprise an outer conductive surface, a first end configured to be coupled to a surface of the component, a second end that receives the cable, and an inner non-conductive material received within the shield adjacent the first end and encasing the connection of the cable to the BGA of the component. The cable may be configured to be coupled to the BGA of the component.

BRIEF DESCRIPTION OF THE DRAWINGS

A more complete understanding of the present technology may be derived by referring to the detailed description and claims when considered in connection with the following illustrative figures. In the following figures, like reference numbers refer to similar elements and steps throughout the figures.

Elements and steps in the figures are illustrated for simplicity and clarity and have not necessarily been rendered according to any particular sequence. For example, steps that may be performed concurrently or in a different order are illustrated in the figures to help to improve understanding of embodiments of the present technology.

DETAILED DESCRIPTION OF EXEMPLARY EMBODIMENTS

The present technology may be described in terms of functional block components and various processing steps. Such functional blocks may be realized by any number of hardware or software components configured to perform the specified functions and achieve the various results. For example, the present technology may employ various cables, sensors, dielectrics, connection types, circuit cards/boards, and the like, which may carry out a variety of analog or digital (MIPI) functions. In addition, the present technology may be practiced in conjunction with any number of applications, and the system described is merely one exemplary application for the technology. Further, the present technology may employ any number of conventional techniques for providing analog or digital (MIPI) control signals, reducing noise, cross-talk, attenuation, impedance, controlling power, and the like.

Methods and apparatus for a shield and cable attachment system according to various aspects of the present technology may operate in conjunction with any suitable electronic sensor, video system, data collection system, and/or other electronic device. Various representative implementations of the present technology may be applied to any appropriate system for imaging such as a temporarily insertable camera system.

RF shields may be used as connectors in various applications where flexibility, space savings, or production constraints limit the applicability of rigid circuit boards or hard wiring.

Referring now to FIGS. 1-6 an RF shield and cable attachment system 100 according to various aspects of the present technology may be used to connect coaxial cables 102 to various components 104 within micro sensing components such as endoscopes, guidewires, catheters, cameras, and the like.

The coaxial cables 102 are used to transmit signals from a source device at a source end to a receiving end such as a display or memory device. The signals may comprise any suitable electrical signals, for example a combination of data, control signals, and power. For example, in one embodiment for use with an imaging system using a camera, a first coaxial cable may provide electrical power to the camera. The camera may be configured with an integrated circuit such as a CMOS imaging sensor, an array, a BGA, or other sensing device that is connected directly to the flex circuit and cable attachment system 100. A second coaxial cable may transmit a clock signal between the camera and the receiving end of the RF shield and cable attachment system 100. A third coaxial cable may transmit an image signal from the camera to the receiving end where the image signal may be displayed or analyzed for processing. In alternative embodiments, additional coaxial cables may be included to transmit additional power lines or signals as required. Similarly, fewer cables may be used if the particular application requires the transmission of fewer signals or less power lines through the RF shield and cable attachment system 100.

The coaxial cables 102 may comprise any suitable type of coaxial cable, such as a cable comprising a center conductor, a dielectric surrounding the center conductor, and a shield covering the dielectric.

Figure 1:
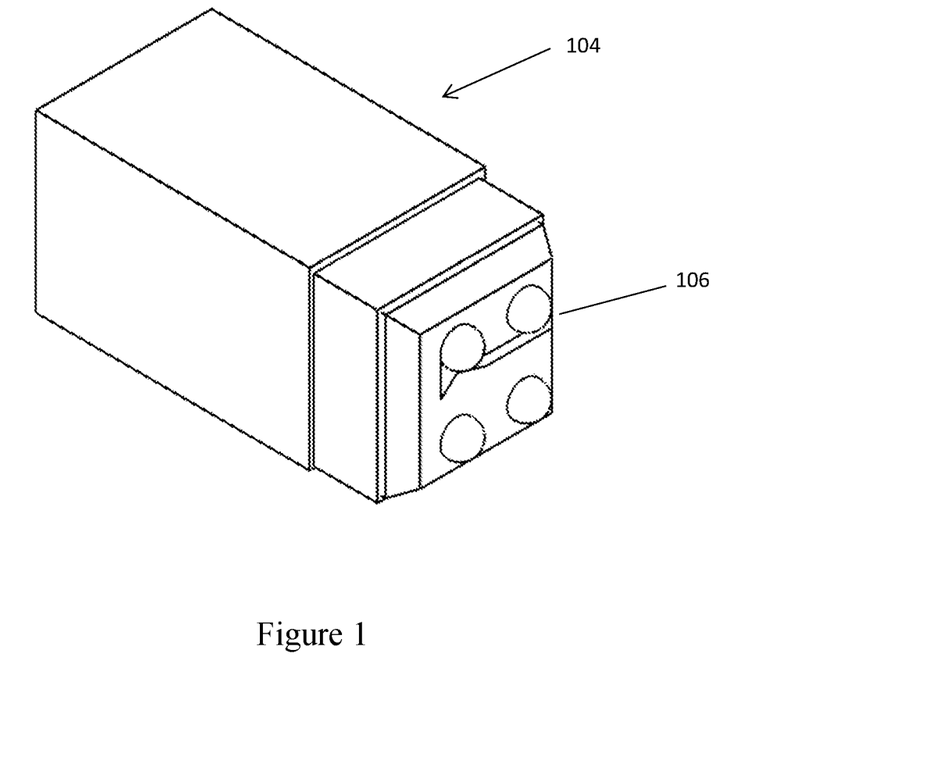
FIG. 1 representatively illustrates a perspective view of a component with a BGA in accordance with an exemplary embodiment of the present technology.
Figure 5:
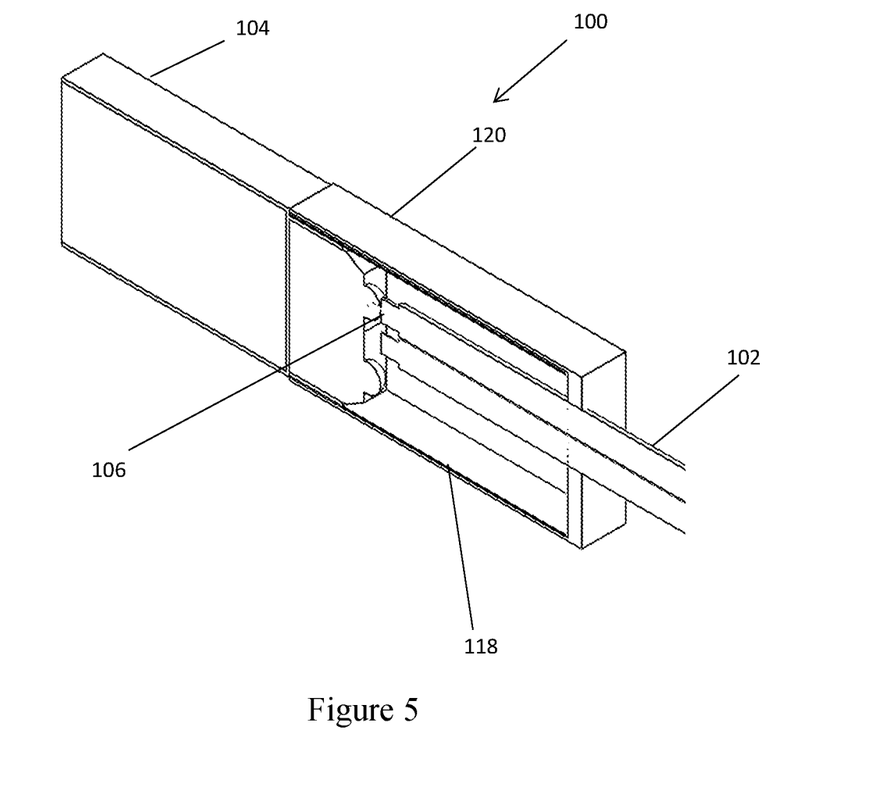
FIG. 5 representatively illustrates a cross-section of FIG. 4 of the component with an RF shield installed along with a non-conductive material to protect the connection of the component to a coaxial cable in accordance with an exemplary embodiment of the present technology.

For example, and referring now to FIG. 1, in one embodiment, the component 104 may comprise a micro-camera having a surface-mount interface, such as a CMOS chip with a BGA 106 positioned on a surface of the micro-camera. As shown in FIG. 5, the cables 102 may be coupled to the BGA 106 on the components.

Figure 2:
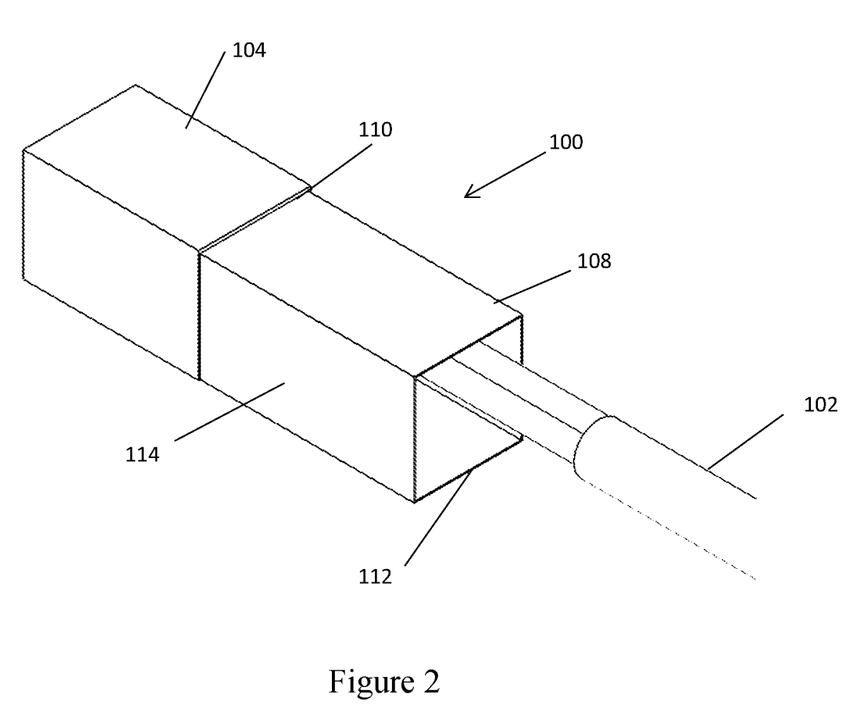
FIG. 2 representatively illustrates a perspective view of the component with an RF shield installed to protect the connection of the component to a coaxial cable in accordance with an exemplary embodiment of the present technology.
Figure 3:
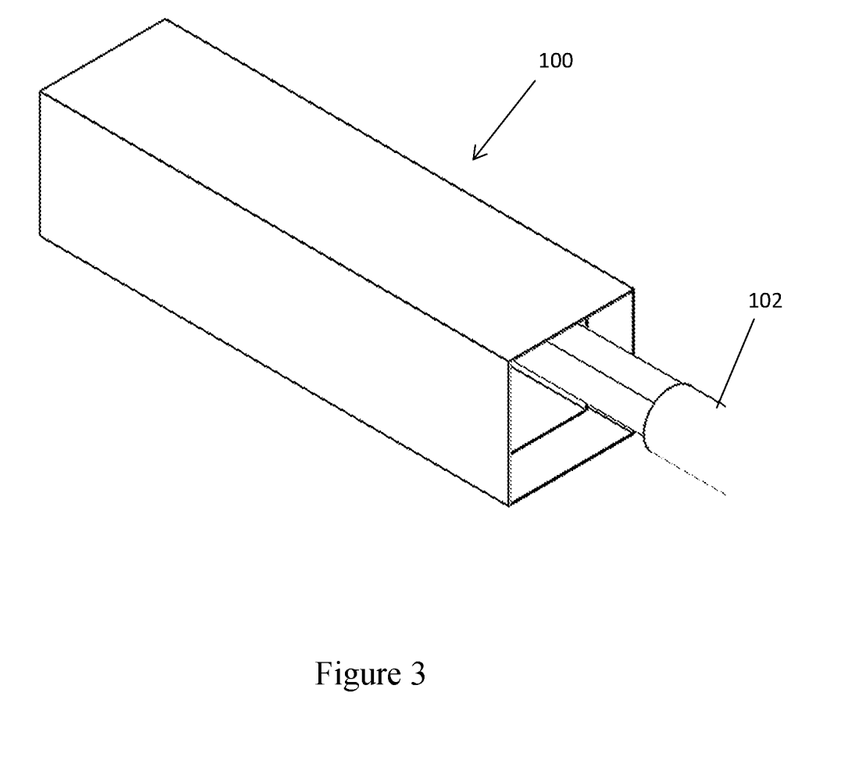
FIG. 3 representatively illustrates a perspective view of the RF shield installed over the entire component to protect the connection of the component to a coaxial cable in accordance with an exemplary embodiment of the present technology.

Referring now to FIG. 2, the RF shield and cable attachment system 100 may comprise a shield 108 comprising first and second ends 110, 112. The first end 110 is connected to the component 104 and the cables 102 are received within the second end 112. It should be understood that the shield, while shown as generally rectangular, can be any shape that conforms with the shape of the component 104 to which it is attached.

In one embodiment, the RF shield and cable attachment system 100 of FIG. 2 may comprise a shield 108 having an outer conductive surface of a thin foil 114 material. In various embodiments, the thin foil 114 material may comprise copper or copper alloy foil. In various embodiments the thin foil 114 material may comprise aluminum or steel foil. The thin foil shield 114 may be coupled to the component by solder, conductive epoxy, mechanical methods, or welded. In one embodiment, while not shown in FIG. 2, the thin foil shield 114 may be partially backfilled with a non-conductive material 118 similar to the embodiment shown in FIG. 5 and described below. In one embodiment, while not shown in FIG. 2, the thin foil shield 114 may be partially backfilled with non-conductive material 118 and then filled with a conductive material 116 similar to the embodiment shown in FIG. 7 and described below. In one embodiment, shown in FIG. 3, the thin foil shield 114 may reside over the entire component 104.

Figure 4:
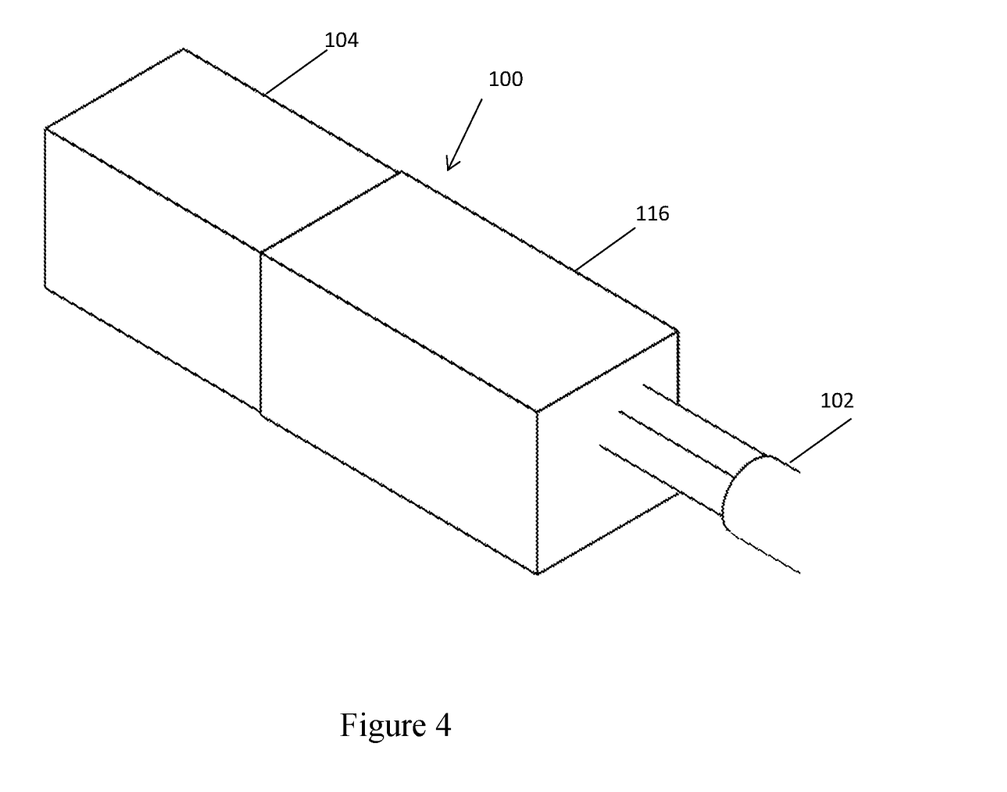
FIG. 4 representatively illustrates a perspective view of the component with an RF shield installed with conductive epoxy to protect the connection of the component to a coaxial cable in accordance with an exemplary embodiment of the present technology.

In one embodiment, shown in FIGS. 4 and 5 the shield 108 may comprise an outer conductive material 120 and the inner non-conductive material 118 that encases the cables. The outer conductive material 120 and the conductive material 116 may comprise a conductive epoxy such as a silver, nickel, or gold filled thermoset adhesives. The outer conductive material 120 and the conductive material 116 may also be an ink or coating that can be applied through spraying or printing. The non-conductive material 118 may comprise non-conductive epoxies, adhesives or fillers with acrylic, cyanoacrylate, polyurethane, silicone, urethane, or other chemistries. The non-conductive material 118 may be formed around the cables 102 to enclose the cable 102 to BGA 106 connection and then the outer conductive material 120 may be formed around the non-conductive material 118 in any suitable shape that conforms with the component 104. In one embodiment, the non-conductive material 118 may be formed around the cables 102 to enclose the cable 102 to BGA 106 connection and the thin foil shield 114 may be formed around the non-conductive material 118 in any suitable shape that conforms with the component 104. In this embodiment the non-conductive material 118 may fill the entire inner space within the thin foil shield 114.

Figure 7:
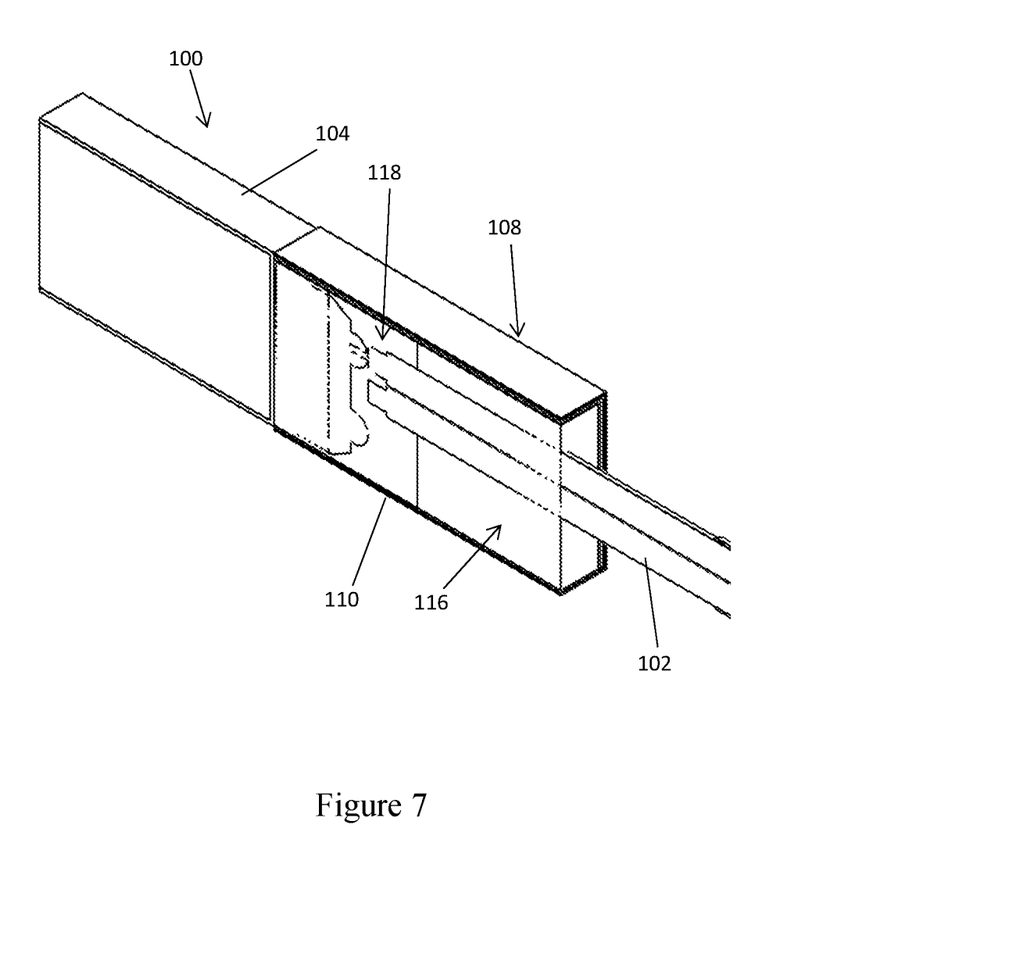
FIG. 7 representatively illustrates a cross-section of the component with an RF shield installed along with a non-conductive material residing around the cables and the conductive epoxy would be placed behind the non-conductive epoxy.

As shown in FIG. 7, the non-conductive epoxy 118 may reside around the cables 102 where the cables 102 are attached to the BGA 106. The conductive epoxy 116 may be placed behind and/or around the non-conductive material 118. In various embodiments, the shield 108, comprising the thin foil shield 114 or the outer conductive material 120 may be formed around the non-conductive material 118 and conductive material 116 in any suitable shape that conforms with the component 104.

Figure 6:
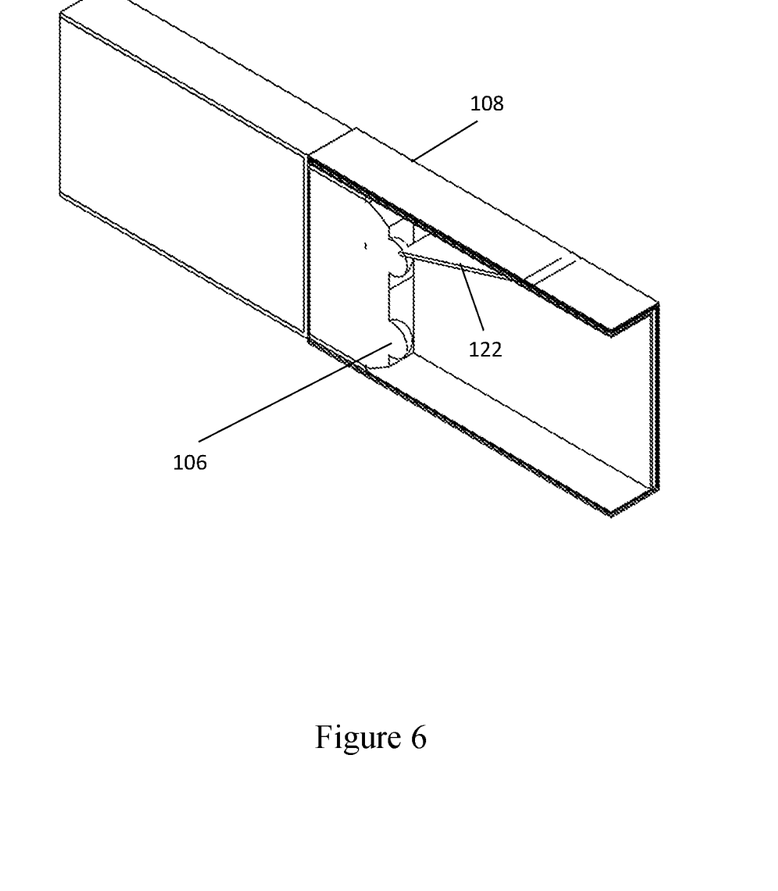
FIG. 6 representatively illustrates a perspective view of the component with an RF shield installed to protect the connection of the component to a coaxial cable where the RF shield is directly coupled to the BGA in accordance with an exemplary embodiment of the present technology.

Referring now to FIG. 6, the shield 108 may comprise a depending tab 122 that may directly connect the thin foil shield 114 or the outer conductive material 120 to the BGA 106 of the component 104. Connection methods for the shield 108 to the BGA 106 may be solder, conductive epoxies, or mechanical means. It should be understood that in this embodiment the non-conductive material 118 may reside around the cables 102 where the cables 102 are attached to the BGA 106. The conductive material 116 would be placed behind and/or around the non-conductive material 118 within the thin foil shield 114

This method of connecting the coaxial cables 102 to the BGA 106 of a component may also provide an improved ability for flexing between the micro-camera 4 and the cable assembly. For example, camera systems that are used to view inside the human body often require that the camera system be able to bend and adjust according to a component inner diameter used to penetrate or diagnose a human body, such as a scope, catheter, guidewire, or flexible introducer sheath.

These and other embodiments for methods of forming the RF shield and cable attachment system 100 may incorporate concepts, embodiments, and configurations as described above. The particular implementations shown and described are illustrative of the technology and its best mode and are not intended to otherwise limit the scope of the present technology in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components.

As used herein, the terms "comprises," "comprising," or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A shield for a cable attachment system for attaching a cable to a component having a ball grid array (BGA), the shield comprising:
   an outer conductive surface;
   a first end configured to be coupled to a surface of the component;
   a second end that receives the cable, wherein the cable is configured to be coupled to the BGA of the component, and wherein the first end and second end are opposite to one another;
   an inner non-conductive material received within the outer conductive surface of the shield adjacent the first end and encasing the connection of the cable to the BGA of the component; and
   a conductive epoxy material applied from the second end and received within the outer conductive surface of the shield adjacent the inner non-conductive material and conformable to surround the cable;
   wherein the outer conductive surface of the shield fully encases the inner non-conductive material.

2. The shield of claim 1, wherein the conductive epoxy material partially extends from the inner non-conductive material to a location inwardly of the second end of the shield.

3. The shield of claim 1, wherein the conductive epoxy material partially extends from the inner non-conductive material to substantially the second end of the shield.

4. The shield of claim 1, wherein the conductive epoxy material extends from the inner non-conductive material to the second end of the shield.

5. The shield of claim 1, wherein the conductive epoxy material surrounds the inner non-conductive material encasing the connection of the cable to the BGA of the component.

6. The shield of claim 1, wherein the outer conductive surface comprises a thin foil material.

7. The shield of claim 6, further comprising a depending tab configured to directly connect the thin foil material to the BGA of the component.

8. The shield of claim 6, wherein the thin foil material comprises at least one of copper, copper foil, aluminum and steel foil.

9. The shield of claim 6, wherein the thin foil shield is configured to be mechanically coupled to the component.

10. The shield of claim 1, further comprising a depending tab configured to couple the outer conductive surface to the BGA of the component.

11. The shield of claim 1, wherein the coupling of the shield to component conforms the outer conductive surface to the shape of the component.

12. A shield for a cable attachment system for attaching a cable to a component having a ball grid array (BGA), the shield comprising:
   an outer conductive surface;
   a first end configured to be coupled to a surface of the component;
   a second end that receives the cable, wherein the cable is configured to be coupled to the BGA of the component, and wherein the first end and second end are opposite to one another;
   an inner non-conductive material received within the shield adjacent the first end and encasing the connection of the cable to the BGA of the component; and
   a conductive epoxy material applied from the second end, received within the shield adjacent to the inner non-conductive material and surrounding the cable;
   wherein the outer conductive surface of the shield fully encases the inner non-conductive material and the conductive epoxy material.

13. The shield of claim 12, wherein the inner non-conductive material fully fills the portion of the shield adjacent the first end where the cable is coupled to the BGA of the component.

14. The shield of claim 12, wherein the conductive epoxy material is received within the shield adjacent to the inner non-conductive material and surrounds the inner non-conductive material and the cable.

15. The shield of claim 12, wherein the conductive epoxy material partially extends from the inner non-conductive material to a location inwardly of the second end of the shield.

16. The shield of claim 12, wherein the conductive epoxy material partially extends from the inner non-conductive material to the substantially the second end of the shield.

17. The shield of claim 12, wherein the conductive epoxy material extends from the inner non-conductive material to the second end of the shield.

18. The shield of claim 12, further comprising a depending tab configured to directly connect the outer conductive surface to the BGA of the component.

19. The shield of claim 12, wherein the conductive epoxy material is conformable to surround the cable.

* * * * *